United States Patent
Mao et al.

(10) Patent No.: US 6,433,972 B1
(45) Date of Patent: Aug. 13, 2002

(54) GIANT MAGNETORESISTIVE SENSOR WITH PINNING LAYER

(75) Inventors: Sining Mao, Savage; Zheng Gao, Bloomington; Hae Seok Cho, Minnetonka; Stephen C. Cool, Edina, all of MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/380,435
(22) PCT Filed: Sep. 1, 1999
(86) PCT No.: PCT/US99/20004
§ 371 (c)(1),
(2), (4) Date: Sep. 1, 1999
(87) PCT Pub. No.: WO00/65578
PCT Pub. Date: Nov. 2, 2000

Related U.S. Application Data

(60) Provisional application No. 60/131,567, filed on Apr. 28, 1999.

(51) Int. Cl.[7] .................................................. G11B 5/39
(52) U.S. Cl. .............................. 360/324.11; 360/324.12
(58) Field of Search ............................ 360/324, 324.1, 360/324.11, 324.12

(56) References Cited

U.S. PATENT DOCUMENTS

| | | | |
|---|---|---|---|
| 5,731,936 A | * 3/1998 | Lee et al. | 360/113 |
| 5,852,533 A | 12/1998 | Miyauchi et al. | 360/113 |
| 6,046,892 A | * 4/2000 | Aoshima et al. | 360/113 |
| 6,178,071 B1 | * 1/2001 | Hasegawa et al. | 360/324.11 |
| 6,210,818 B1 | * 4/2001 | Saito | 428/692 |
| 6,222,707 B1 | * 4/2001 | Huai et al. | 360/324.1 |
| 6,258,468 B1 | * 7/2001 | Mahvan et al. | 428/679 |
| 6,278,592 B1 | * 8/2001 | Xue et al. | 360/324.12 |
| 6,282,069 B1 | * 8/2001 | Nakazawa et al. | 360/324.2 |

FOREIGN PATENT DOCUMENTS

| | | | |
|---|---|---|---|
| EP | 0883196 | * | 12/1998 |
| JP | 10-177706 | * | 6/1998 |
| JP | 9-265474 | * | 4/1999 |
| JP | 9-268811 | * | 4/1999 |
| JP | 11 112052 | | 4/1999 |

* cited by examiner

Primary Examiner—Jefferson Evans
(74) Attorney, Agent, or Firm—Kinney & Lange, P.A.

(57) ABSTRACT

A giant magnetoresistive stack (10) for use in a magnetic read head includes a NiFeCr seed layer (12), a ferromagnetic free layer (14), a nonmagnetic spacer layer (16), a ferromagnetic pinned layer (18), and a PtMnX pinning layer (20), where X is either Cr or Pd. The ferromagnetic free layer (14) has a rotatable magnetic moment and is positioned adjacent to the NiFeCr seed layer (12). The ferromagnetic pinned layer (18) has a fixed magnetic moment and is positioned adjacent to the PtMnX pinning layer (20). The nonmagnetic spacer layer (16) is positioned between the free layer (14) and the pinned layer (18).

18 Claims, 3 Drawing Sheets

GIANT MAGNETORESISTIVE SENSOR WITH PINNING LAYER

CROSS REFERENCE TO RELATED APPLICATION

This application claims priority from Provisional Application No. 60/131,567, filed Apr. 28, 999 for "PtMn (Cr and PD) Pinned and NiFeCr Seeded Spin Valve Heads for Good Thermal Stability and Magnetic Stability" by Sining Mao, Zheng Gao, Haeseok Cho and Stephen C. Cool.

BACKGROUND OF THE INVENTION

The present invention relates generally to a giant magnetoresistive sensor for use in a magnetic read head. In particular, the present invention relates to a giant magnetoresistive read sensor having improved thermal and magnetic stability.

Giant magnetoresistive (GMR) read sensors are used in magnetic data storage systems to detect magnetically-encoded information stored on a magnetic data storage medium such as a magnetic disc. A time-dependent magnetic field from a magnetic medium directly modulates the resistivity of the GMR read sensor. A change in resistance of the GMR read sensor can be detected by passing a sense current through the GMR read sensor and measuring the voltage across the GMR read sensor. The resulting signal can be used to recover the encoded information from the magnetic medium.

A typical GMR read sensor configuration is the GMR spin valve, in which the GMR read sensor is a multi-layered structure formed of a nonmagnetic spacer layer positioned between a ferromagnetic pinned layer and a ferromagnetic free layer. The magnetization of the pinned layer is fixed in a predetermined direction, typically normal to an air bearing surface of the GMR read sensor, while the magnetization of the free layer rotates freely in response to an external magnetic field. The resistance of the GMR read sensor varies as a function of an angle formed between the magnetization direction of the free layer and the magnetization direction of the pinned layer. This multi-layered spin valve configuration allows for a more pronounced magnetoresistive effect, i.e. greater sensitivity and higher total change in resistance, than is possible with anisotropic magnetoresistive (AMR) read sensors, which generally consist of a single ferromagnetic layer.

A pinning layer is typically exchange coupled to the pinned layer to fix the magnetization of the pinned layer in a predetermined direction. The pinning layer is typically formed of an antiferromagnetic material. In antiferromagnetic materials, the magnetic moments of adjacent atoms point in opposite directions and, thus, there is no net magnetic moment in the material.

A seed layer is typically used to promote the texture and enhance the grain growth of the free layer consequently grown on top of it. The seed layer material is chosen such that its atomic structure, or arrangement, corresponds with the preferred crystallographic direction of the magnetization of the free layer material.

Principal concerns in the performance of GMR read sensors are the thermal and magnetic stability of the GMR read sensor. When the pinning layer is exchange coupled to the pinned layer during manufacturing, the GMR read sensor must not experience diffusion between thin layers in the GMR read sensor. After the pinning layer is exchange coupled to the pinned layer to fix the magnetization of the pinned layer in a predetermined direction, a sufficient exchange coupling field, or pinning field, is required to keep the magnetization of the pinned layer, unchanged during the operation of the GMR read sensor.

Key determinants of the thermal and magnetic stability of the GMR read sensor are the materials used as the pinning layer and as the seed layer in the GMR read sensor. The annealing temperature of the pinning layer material is the temperature at which the pinning and pinned layers are exchange coupled during manufacturing. It is desirable for the pinning layer material to have a low annealing temperature to control magnetic behavior and prevent diffusion between thin layers in the GMR spin valve. The blocking temperature of the pinning layer material is the temperature at which the exchange coupling disappears. It is desirable for the pinning layer material to have a high blocking temperature to prevent the magnetization of the pinned layer from changing during the operation of the GMR read sensor. Also, the seed layer material affects the strength of the exchange coupling field, or pinning strength. It is desirable for the seed layer material/pinning layer material combination to have a high pinning strength to keep the magnetization of the pinned layer unchanged.

Accordingly, there is a need for a pinning layer material with a high blocking temperature and a low annealing temperature, and for a seed layer material that, when used with the pinning layer material, produces a high pinning strength.

BRIEF SUMMARY OF THE INVENTION

The present invention is a giant magnetoresistive stack for use in a magnetic read head. The giant magnetoresistive stack includes a NiFeCr seed layer, a ferromagnetic free layer, a nonmagnetic spacer layer, a ferromagnetic pinned layer, and a PtMnX pinning layer, where X is either Cr or Pd. The free layer has a rotatable magnetic moment and is positioned adjacent to the NiFeCr seed layer. The pinned layer has a fixed magnetic moment and is positioned adjacent to the PtMnX pinning layer. The spacer layer is positioned between the free layer and the pinned layer. In a first preferred embodiment, the free layer is a NiFe/CoFe bilayer, the spacer layer is formed of copper, and the pinned layer is formed of CoFe. In a second preferred embodiment, the free layer is a NiFe/CoFe bilayer, the spacer layer is formed of copper, and the pinned layer is a CoFe/Ru/CoFe synthetic antiferromagnet.

DETAILED DESCRIPTION OF THE PREFERRED EMBODIMENTS

Figure 1:
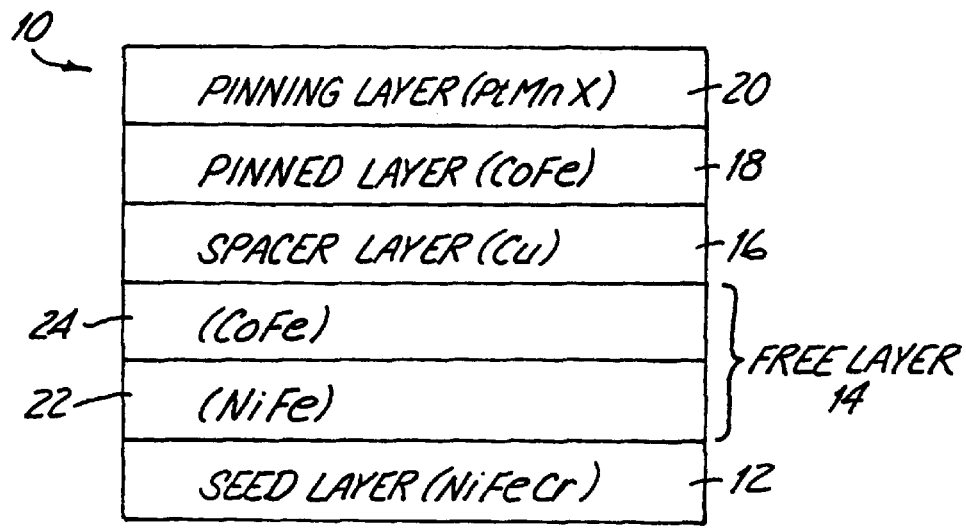
FIG. 1 is a layer diagram of a first embodiment of a giant magnetoresistive stack of the present invention.

FIG. 1 is a layer diagram of a first embodiment of a giant magnetoresistive (GMR) stack 10 of the present invention.

GMR stack 10 includes a seed layer 12, a free layer 14, a spacer layer 16, a pinned layer 18, and a pinning layer 20. Seed layer 12 is NiFeCr. Free layer 14 includes a first ferromagnetic layer 22, preferably NiFe, and a second ferromagnetic layer 24, preferably CoFe, and is positioned such that the first ferromagnetic layer 22 is adjacent to seed layer 12. Pinned layer 18 is a ferromagnetic material, preferably CoFe, and is positioned adjacent to pinning layer 20. Pinning layer 20 is PtMnX, where X is selected from the group consisting of Cr, Pd, Nb, Re, Rh, and Ta. Spacer layer 16 is a nonmagnetic material, preferably copper, and is positioned between free layer 14 and pinned layer 18.

The magnetization of pinned layer 18 is fixed in a predetermined direction while the magnetization of free layer 14 rotates freely in response to an external magnetic field emanating from a magnetic medium. The magnetization of pinned layer 18 is pinned by exchange coupling pinning layer 20 with pinned layer 18. Pinning layer has a blocking temperature of about 380° C. and an annealing temperature of about 270° C. The atomic structure of seed layer 12 is face-centered cubic (fcc) which promotes the [111] crystallographic texture and enhances the grain growth of free layer 14. The resistance of GMR stack 10 varies as a function of an angle that is formed between the magnetization of free layer 14 and the magnetization of pinned layer 18.

The composition of seed layer 12 is preferably in the range of about Ni(60)Fe(15)Cr(25) to about Ni(48)Fe(12)Cr(40), and more preferably approximately Ni(48)Fe(12)Cr(40), where the numbers in parentheses represent atomic percentage. The thickness of seed layer 12 is preferably in the range of about 20 Å to about 60 Å, and more preferably in the range of about 45 Å to about 50 Å.

The composition of the first ferromagnetic layer 22 of free layer 14 is preferably in the range of about Ni(85)Fe(15) to about Ni(80.5)Fe(19.5), and more preferably approximately Ni(82)Fe(18). The thickness of the first ferromagnetic layer 22 of free layer 14 is preferably in the range of about 20 Å to about 100 Å, and more preferably approximately 30 Å. The composition of the second ferromagnetic layer 24 of free layer 14 is preferably approximately Co(90)Fe(10). The thickness of the second ferromagnetic layer 24 of free layer 14 is preferably in the range of about 5 Å to about 25 Å, and more preferably approximately 13 Å.

The thickness of spacer layer 16 is preferably in the range of about 20 Å to about 35 Å, and more preferably approximately 24 Å.

The composition of pinned layer 18 is preferably approximately Co(90)Fe(10). The thickness of pinned layer 18 is preferably in the range of about 18 Å to about 30 Å, and more preferably approximately 25 Å.

The composition of pinning layer 20 when PtMnCr is used is preferably in the range of about Pt(36)Mn(64)Cr(>0) to about Pt(48)Mn(51)Cr(1), and more preferably approximately Pt(44)Mn(55.5)Cr(0.5). The thickness of pinning layer 20 in this case is preferably in the range of about 100 Å to about 300 Å, and more preferably approximately 200 Å. The composition of pinning layer 20 when PtMnPd is used is preferably in the range of about Pt(15)Mn(50)Pd(35) to about Pt(25)Mn(50)Pd(25), and more preferably approximately Pt(20)Mn(50)Pd(30). The thickness of pinning layer 20 in this case is preferably in the range of about 150 Å to about 300 Å, and more preferably approximately 250 Å.

Figure 2:
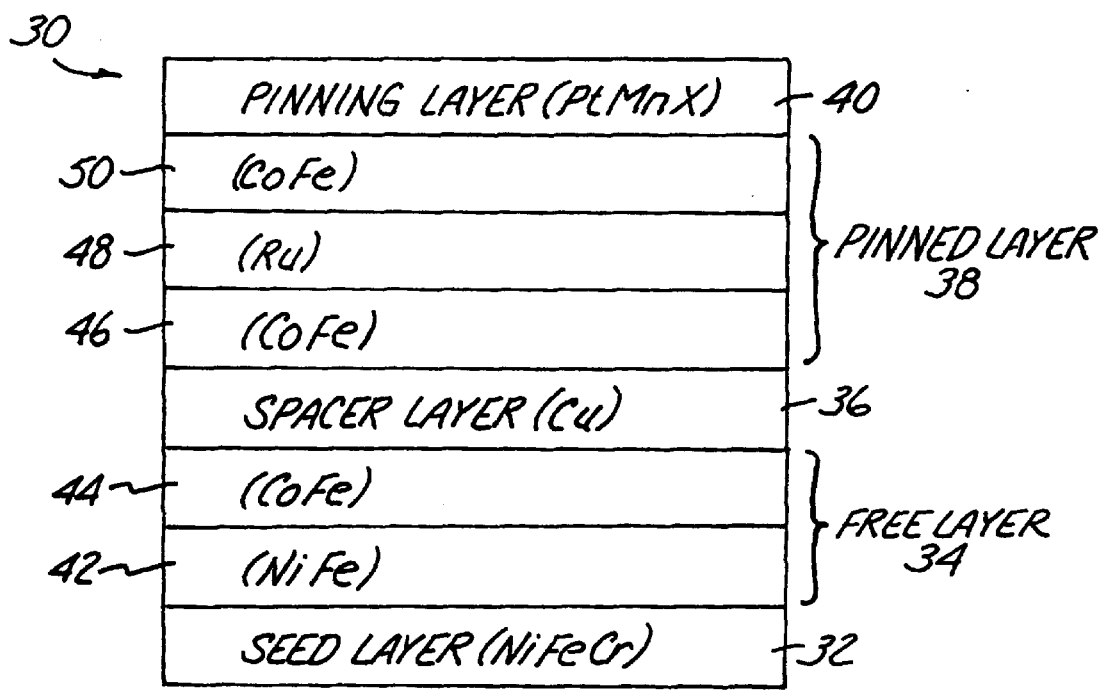
FIG. 2 is a layer diagram, of a second embodiment of a giant magnetoresistive stack of the present invention.

FIG. 2 is a layer diagram of a second embodiment of a GMR stack 30 of the present invention. GMR stack 30 includes a seed layer 32, a free layer 34, a spacer layer 36, a pinned layer 38, and a pinning layer 40. Seed layer 32 is NiFeCr. Free layer 34 includes a first ferromagnetic layer 42, preferably NiFe, and a second ferromagnetic layer 44, preferably CoFe, and is positioned such that the first ferromagnetic layer 42 is adjacent to seed layer 32. Pinned layer 38 is a synthetic antiferromagnet and includes first and second ferromagnetic layers 46 and 50, both preferably CoFe, and a coupling layer 48, preferably ruthenium, positioned between first and second ferromagnetic layers 46 and 50, and is positioned such that the second ferromagnetic layer 50 is adjacent to pinning layer 40. Pinning layer 40 is PtMnX, where X is selected from the group consisting of Cr, Pd, Nb, Re, Rh, and Ta. Spacer layer 36 is a nonmagnetic material, preferably copper, and is positioned between free layer 34 and pinned layer 38.

The magnetization of pinned layer 38 is fixed in a predetermined direction while the magnetization of free layer 34 rotates freely in response to an external magnetic field emanating from a magnetic medium. The magnetization of pinned layer 38 is pinned by exchange coupling pinning layer 40 with pinned layer 38. Pinning layer 40 has a blocking temperature of about 380° C. and an annealing temperature of about 270° C. The atomic structure of seed layer 32 is face-centered cubic (fcc) which promotes the [111] crystallographic texture and enhances the grain growth of free layer 34. The resistance of GMR stack 30 varies as a function of an angle that is formed between the magnetization of free layer 34 and the magnetization of pinned layer 38.

The composition of seed layer 32 is preferably in the range of about Ni(60)Fe(15)Cr(25) to about Ni(48)Fe(12)Cr(40), and more preferably approximately Ni(48)Fe(12)Cr(40). The thickness of seed layer 32 is preferably in the range of about 20 Å to about 60 Å, and more preferably in the range of about 45 Å to about 50 Å.

The composition of the first ferromagnetic layer 42 of free layer 34 is preferably in the range of about Ni(85)Fe(15) to about Ni(80.5)Fe(19.5), and more preferably approximately Ni(82)Fe(18). The thickness of the first ferromagnetic layer 42 of free layer 34 is preferably in the range of about 20 Å to about 100 Å, and more preferably approximately 30 Å. The composition of the second ferromagnetic layer 44 of free layer 34 is preferably approximately Co(90)Fe(10). The thickness of the second ferromagnetic layer 44 of free layer 34 is preferably in the range of about 5 Å to about 25 Å, and more preferably approximately 13 Å.

The thickness of spacer layer 36 is preferably in the range of about 20 Å to about 35 Å, and more preferably approximately 24 Å.

The compositions of the first and second ferromagnetic layers 46 and 50 of pinned layer 38 are both preferably approximately Co(90)Fe(10). The thicknesses of the first and second ferromagnetic layers 46 and 50 of pinned layer 38 are both preferably in the range of about 15 Å to about 40 Å, and more preferably in the range of about 25 Å to about 30 Å. The thickness of coupling layer 48 of pinned layer 38 is preferably in the range of about 8 Å to about 12 Å.

The composition of pinning layer 40 when PtMnCr is used is preferably in the range of about Pt(36)Mn(64)Cr(>0) to about Pt(48)Mn(51)Cr(1), and more preferably approximately Pt(44)Mn(55.5)Cr(0.5). The thickness of pinning layer 40 in this case is preferably in the range of about 100 Å to about 300 Å, and more preferably approximately 200 Å. The composition of pinning layer 40 when PtMnPd is used is preferably in the range of about Pt(15)Mn(50)Pd(35)

to about Pt(25)Mn(50)Pd(25), and more preferably approximately Pt(20)Mn(50)Pd(30). The thickness of pinning layer 40 in this case is preferably in the range of about 150 Å to about 300 Å, and more preferably approximately 250 Å.

Figure 3:
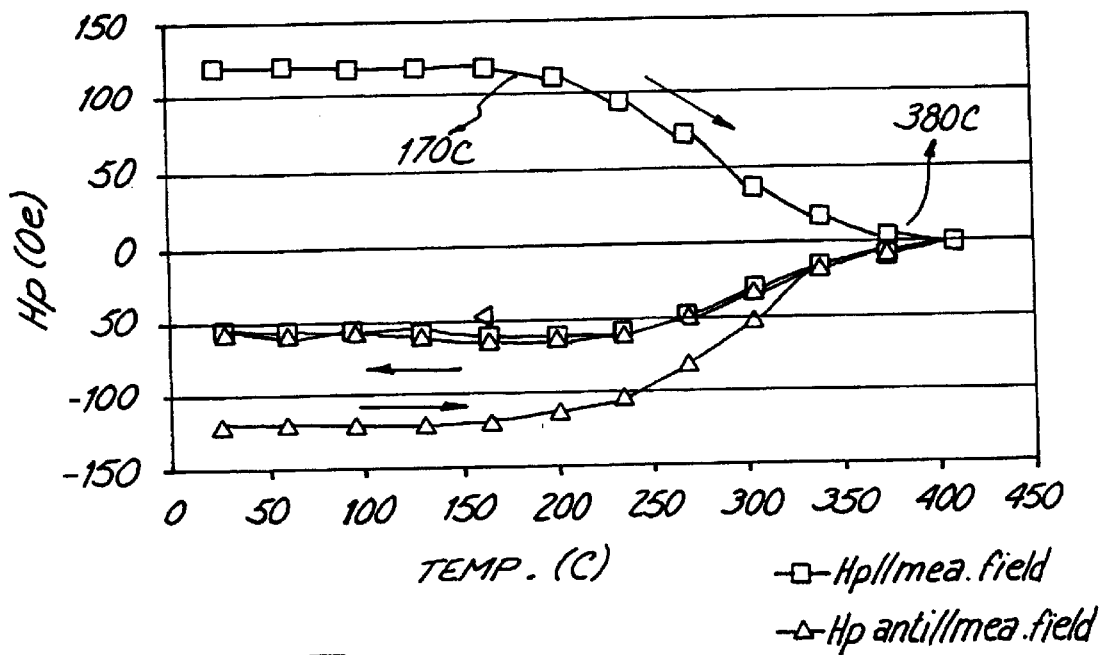
FIG. 3 is a graph of the blocking temperature measurement of a PtMnX pinning layer, where X is either Cr or Pd.

FIG. 3 is a graph of the blocking temperature measurement of a PtMnX pinning layer, where X is either Cr or Pd. The graph shows the strength of the exchange coupling (Oe) as a function of temperature (°C.). At 386° C. the strength of the exchange coupling becomes 0 Oe.

Figure 4:
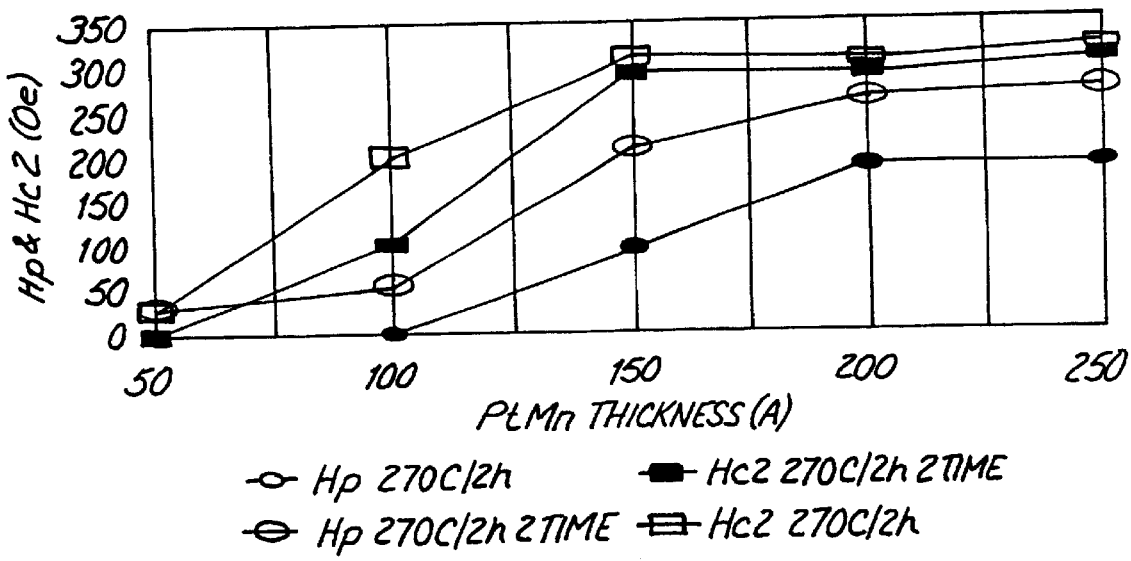
FIG. 4 is a graph of the pinning strength measurement of the first embodiment of a giant magnetoresistive stack of the present invention.

FIG. 4 is a graph of the pinning strength measurement of GMR stack 10 of the present invention. The graph shows the strength of the exchange coupling (Oe) as a function of the thickness of the pinning layer (Å) at a temperature of 270° C.

Figure 5:
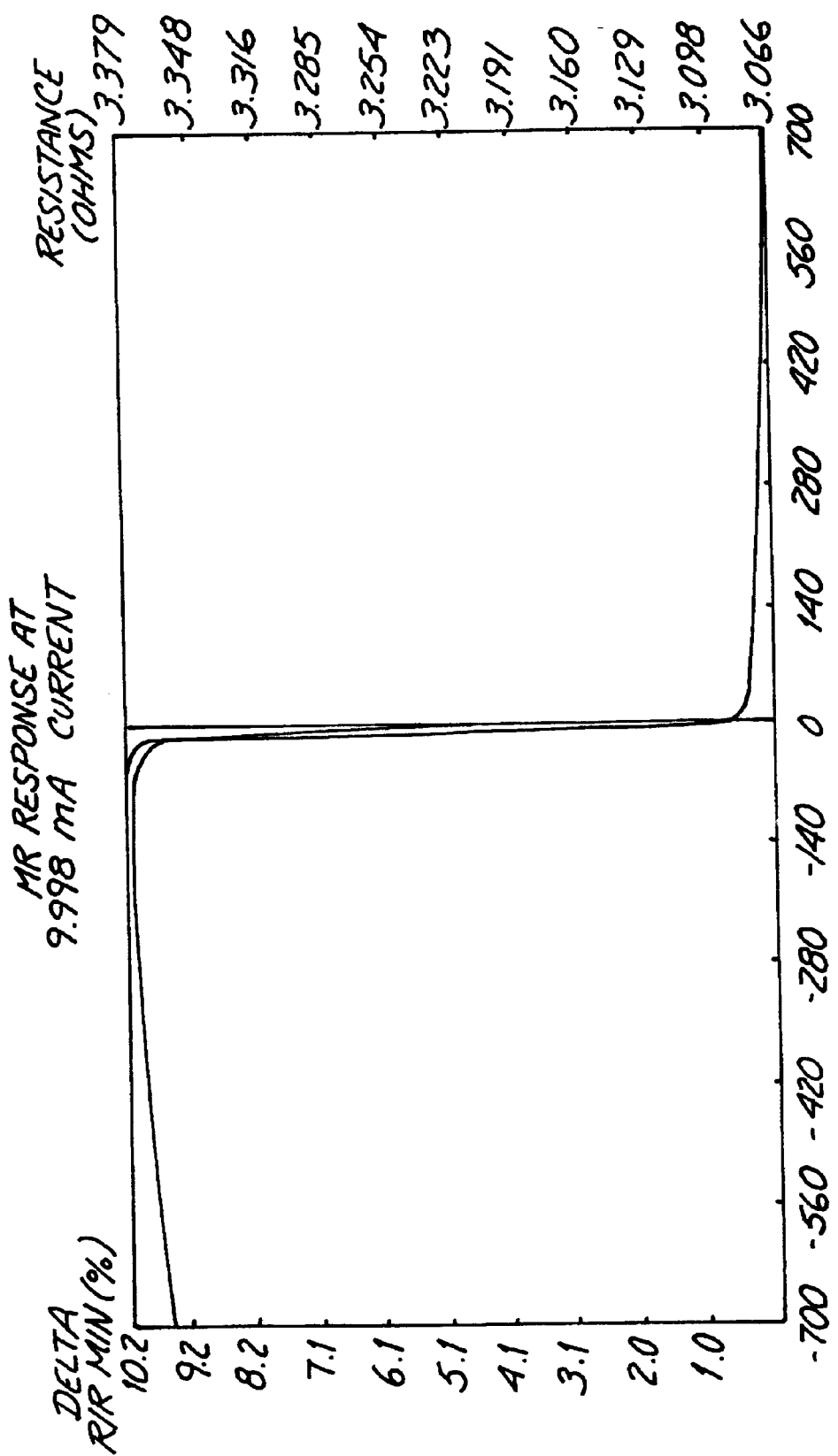
FIG. 5 is a graph of the GMR response of the second embodiment of a giant magnetoresistive stack of the present invention.

FIG. 5 is a graph of the GMR response of GMR stack 30 of the present invention. The graph shows the GMR ratio (the maximum absolute change in resistance of the GMR read sensor divided by the resistance of the GMR read sensor multiplied by 100%) of stack 30 as a function of an applied magnetic field (Oe). The GMR ratio of GMR stack 30 is about 10.3%.

In summary, the present invention introduces a GMR read sensor with a NiFeCr seed layer and a PtMaX pinning layer, where X is selected from the group consisting of Cr, Pd, Nb, Re, Rh, and Ta. The pinning layer has a high blocking temperature of about 380° C. to prevent the exchange coupling from disappearing. Also, the pinning layer has a low annealing temperature of about 270° C. to control magnetic behavior and prevent diffusion between thin layers in the GMR read sensor during manufacturing. In addition, the seed layer/pinning layer combination produces a high pinning strength. The resulting GMR read sensor produces a high GMR ratio of about 10.3%.

Although the present invention has been described with reference to preferred embodiments, workers skilled in the art will recognize that changes may be made in form and detail without departing from the spirit and scope of the invention.

What is claimed is:

1. A giant magnetoresistive stack for use in a magnetic read head, the giant magnetoresistive stack comprising:
   a NiFeCr seed layer;
   a ferromagnetic free layer having a rotatable magnetic moment positioned adjacent to the seed layer;
   a ferromagnetic pinned layer having a fixed magnetic moment;
   a PtMnX pinning layer positioned adjacent to the pinned layer, where X is selected from the group consisting of Cr, Pd, Nb, Re, Rh, and Ta; and
   a nonmagnetic spacer layer positioned between the free layer and the pinned layer.

2. The giant magnetoresistive stack of claim 1 wherein the free layer is a bilayer comprising:
   a NiFe layer positioned adjacent to the seed layer; and
   a CoFe layer positioned adjacent to the spacer layer.

3. The giant magnetoresistive stack of claim 2 wherein:
   the NiFe layer has a thickness in a range of about 20 Å to about 100 Å; and
   the CoFe layer has a thickness in a range of about 5 Å to about 25 Å.

4. The giant magnetoresistive stack of claim 1 wherein the pinned layer is a synthetic antiferromagnet.

5. The giant magnetoresistive stack of claim 4 wherein the synthetic antiferromagnet comprises:
   a first CoFe layer positioned adjacent to the spacer layer;
   a second CoFe layer positioned adjacent to the pinning layer; and
   a ruthenium layer positioned between the first and second CoFe layers.

6. The giant magnetoresistive stack of claim 5 wherein: the first and second CoFe layers have thicknesses in a range of about 15 Å to about 40 Å; and the ruthenium layer has a thickness in a range of about 8 Å to about 12 Å.

7. The giant magnetoresistive stack of claim 1 wherein the seed layer has a thickness in a range of about 20 Å to about 60 Å.

8. The giant magnetoresistive stack of claim 9 wherein the thickness of the seed layer is in a range of about 45 Å to about 50 Å.

9. The giant magnetoresistive stack of claim 1 wherein the seed layer has a Cr atomic percentage of between about 25 and about 40.

10. The giant magnetoresistive stack of claim 1 wherein the pinned layer has a thickness in a range of about 20 Å to about 30 Å.

11. The giant magnetoresistive stack of claim 1 wherein the pinning layer has a thickness in a range of about 100 Å to about 300 Å.

12. The giant magnetoresistive stack of claim 1 wherein X is Cr and has an atomic percentage of between about 0 and about 1.

13. The giant magnetoresistive stack of claim 1 wherein X is Pd and has an atomic percentage of between about 25 and about 35.

14. A method for forming a giant magnetoresistive stack for use in a magnetic read head, the method comprising:
   depositing a seed layer of NiFeCr;
   depositing a free layer of a ferromagnetic material having a magnetic moment over the seed layer;
   depositing a spacer layer of a nonmagnetic material over the free layer;
   depositing a pinned layer of a ferromagnetic material having a magnetic moment over the spacer layer; and
   depositing a pinning layer of PtMnX over the pinned layer, where X is selected from the group consisting of Cr, Pd, Nb, Re, Rh, and Ta.

15. The method for forming a giant magnetoresistive stack of claim 14 wherein:
   the seed layer has a thickness in a range of about 20 Å to about 60 Å; and
   the pinning layer has a thickness in a range of about 100 Å to about 300 Å.

16. The method of forming a giant magnetoresistive stack of claim 14 wherein the seed layer has a Cr atomic percentage of between about 25 and about 40.

17. The method of forming a giant magnetoresistive stack of claim 14 wherein X is Cr and has an atomic percentage of between about 0 and about 1.

18. The method of forming a giant magnetoresistive stack of claim 14 wherein X is Pd and has an atomic percentage of between about 25 and about 35.

* * * * *

UNITED STATES PATENT AND TRADEMARK OFFICE
CERTIFICATE OF CORRECTION

PATENT NO.   : 6,433,972 B1
DATED        : August 3, 2002
INVENTOR(S)  : Sining Mao et al.

It is certified that error appears in the above-identified patent and that said Letters Patent is hereby corrected as shown below:

<u>Column 5,</u>
Line 8, delete "386º", insert -- 380º --

<u>Column 6,</u>
Line 15, delete "9", insert -- 7 --

Signed and Sealed this

Twenty-second Day of April, 2003

JAMES E. ROGAN
*Director of the United States Patent and Trademark Office*